United States Patent
Cohen

(10) Patent No.: US 9,007,585 B2
(45) Date of Patent: Apr. 14, 2015

(54) IMAGING OVERLAY METROLOGY TARGET AND COMPLIMENTARY OVERLAY METROLOGY MEASUREMENT SYSTEM

(71) Applicant: KLA-Tencor Corporation, Milpitas, CA (US)

(72) Inventor: Guy Cohen, Yaad (IL)

(73) Assignee: KLA-Tencor Corporation, Milpitas, CA (US)

(\*) Notice: Subject to any disclaimer, the term of this patent is extended or adjusted under 35 U.S.C. 154(b) by 0 days.

(21) Appl. No.: 13/783,903

(22) Filed: Mar. 4, 2013

(65) Prior Publication Data

US 2013/0242305 A1 Sep. 19, 2013

Related U.S. Application Data

(60) Provisional application No. 61/607,958, filed on Mar. 7, 2012.

(51) Int. Cl.
*G01B 11/00* (2006.01)
*G03F 7/20* (2006.01)
*H01L 23/544* (2006.01)

(52) U.S. Cl.
CPC .......... *G03F 7/70633* (2013.01); *H01L 23/544* (2013.01)

(58) Field of Classification Search
USPC ............ 356/399–401, 614; 430/30, 324, 322; 257/48, E23.179; 438/14, 16, 7, 975; 382/143, 144, 145
See application file for complete search history.

(56) References Cited

U.S. PATENT DOCUMENTS

2005/0012928 A1 1/2005 Sezginer et al.

FOREIGN PATENT DOCUMENTS

| WO | 2007-008473 A2 | 1/2007 |
| WO | 2007-053376 A2 | 5/2007 |
| WO | 2011-003736 A1 | 1/2011 |

*Primary Examiner* — Tri T Ton
(74) *Attorney, Agent, or Firm* — Suiter Swantz pc llo

(57) ABSTRACT

An exclusion region of interest imaging overlay target includes a self-symmetric target structure including two or more pattern elements, and an additional target structure including two or more pattern elements, wherein each of pattern elements of the additional target structure is contained within a boundary defined by one of the pattern elements of the self-symmetric target structure, wherein the self-symmetric target structure is characterized by a composite exterior region of interest, wherein the composite exterior region of interest is formed by removing two or more exclusion zones corresponding with the pattern elements of the additional target structure from an exterior region of interest encompassing the self-symmetric target structure, wherein each of the pattern elements of the additional target structure is characterized by an interior region of interest, wherein the self-symmetric target structure and the additional target structure are configured to have a common center of symmetry upon alignment.

48 Claims, 12 Drawing Sheets

IMAGING OVERLAY METROLOGY TARGET AND COMPLIMENTARY OVERLAY METROLOGY MEASUREMENT SYSTEM

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled METROLOGY PROCESS ROBUST TARGET AND MEASUREMENT METHOD, naming Guy Cohen as inventor, filed Mar. 7, 2012, Application Ser. No. 61/607,958.

TECHNICAL FIELD

The present invention generally relates to an overlay target used for imaging overlay metrology, and more particularly to an overlay target having overlapping target structures and complimentary metrology measurement systems.

BACKGROUND

In a variety of manufacturing and production settings, there is a need to control alignment between various layers or within particular layers of a given sample. For example, in the context of semiconductor processing, semiconductor-based devices may be produced by fabricating a series of layers on a substrate, some or all of the layers including various structures. The relative position of these structures both within a single layer and with respect to structures in other layers is critical to the performance of the devices. The misalignment between various structures is known as overlay error.

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer. Presently, overlay measurements are performed via test patterns that are printed together with layers of the wafer. The images of these test patterns are captured via an imaging tool and an analysis algorithm is used to calculate the relative displacement of the patterns from the captured images. Such overlay metrology targets (or 'marks') generally comprise features formed in two or more layers, the features configured to enable measurement of spatial displacement between features of the layers (i.e., the overlay or displacement between layers).

In a standard metrology target design, each target layer is assigned at least two pattern elements (e.g., square, rectangle and the like) that have a single center of symmetry. The centers of symmetry of a target structure of a first layer and a target structure of a second layer are designed such that they are at the same location when overlay is zero (i.e., target structures of each layer are aligned). In settings where non-zero overlay exists, the center of symmetry of one layer is shifted with respect to the center of symmetry of the second layer. Typically, in order to determine the symmetry point of each layer, a region of interest (ROI) is generated that surrounds each pattern element of each target structure of each layer. Therefore, the entire target includes the multiple target structures consisting of the various ROIs needed to characterize the constituent pattern elements of the target structures of the target, whereby the overall area of the target is determined by the size of the various structures of the target.

Further, in some instances, process design rules for the sample (e.g., wafer) require the use of segmented pattern elements of the target structures of the target. In the case of a target including segmented pattern elements, overlay is reliable in only one direction, the direction perpendicular to the segmentation lines of the pattern elements (e.g., 'thin' rectangle parallel aligned lines). Therefore, in order to adequately measurement overlay in both the X- and Y-directions target area must be increased by a factor of two to account for the needed additional target structures.

FIG. 1A illustrates a known overlay target 100 having 90 degree rotational symmetry, respectively, about a center of symmetry 110. Each of the target structures of FIG. 1A include pattern elements (e.g., 102a through 104b), which are individually invariant to 90 degree rotation. Due to the 90 degree invariance of the individual pattern elements, the pattern elements of targets 100 of FIGS. 1A are suitable for both X-overlay and Y-overlay measurements.

FIG. 1B illustrates target 150 which displays invariance to a 90 degree rotation. In contrast to FIG. 1A, the individual pattern elements (e.g., 202a through 204d) display only 180 degree rotational symmetry. As such, at least two separate orthogonally oriented pattern elements must be used in order to measure overlay in both the X- and Y-direction. For instance, the pattern elements 202a, 204a, 202d, and 204d may be used to measure overlay in a first direction, while elements 202b, 204b, 204c, and 202c may be used to measure overlay in a second direction orthogonal to the first direction. Due to the increased target structures required to perform multi-directional overlay measurements, additional space is needed on a given sample (e.g., wafer) to accommodate the additional target structures. It is therefore advantageous to provide a metrology target and a system and method for implementing such a metrology target that cures the defects of the prior.

SUMMARY

An imaging overlay metrology target is disclosed. In one aspect, the overlay metrology target may include, but is not limited to, a self-symmetric target structure including two or more pattern elements, at least an additional target structure including two or more pattern elements, wherein each of the two or more pattern elements of the at least an additional target structure is contained within a boundary defined by one of the two or more pattern elements of the self-symmetric target structure; wherein the self-symmetric target structure is characterized by a composite exterior region of interest, wherein the composite exterior region of interest is formed by removing two or more exclusion zones corresponding with the two or more pattern elements of the at least an additional target structure from an exterior region of interest encompassing the self-symmetric target structure, wherein the two or more pattern elements of the at least an additional target structure are characterized by two or more interior regions of interest, wherein each of the pattern elements of the at least an additional target structure is characterized by an interior region of interest, wherein the two or more interior regions of interest are contained within the exterior region of interest, wherein the self-symmetric target structure and the at least an additional target structure are configured to have a common center of symmetry upon alignment of the self-symmetric target structure and the at least an additional target structure, wherein the self-symmetric structure is invariant to N degree rotation about the common center of symmetry, wherein the at least an additional target structure is invariant to M degree rotation about the individual center of symmetry.

In another aspect, the imaging overlay metrology target may include, but is not limited to, a self-symmetric target structure including a single pattern element, at least an additional target structure including one or more pattern elements, wherein the one or more pattern elements of the at least an additional target structure are contained within a boundary defined by the single pattern element of the self-symmetric target structure, wherein the self-symmetric target structure is characterized by a composite exterior region of interest, wherein the composite exterior region of interest is formed by removing one or more exclusion zones corresponding with the one or more pattern elements of the at least an additional target structure from an exterior region of interest encompassing the self-symmetric target structure, wherein the one or more pattern elements of the at least an additional target structure are characterized by one or more interior regions of interest, wherein the one or more interior regions of interest are contained within the exterior region of interest, wherein the self-symmetric target structure and the at least an additional target structure are configured to share a common center of symmetry upon alignment of the self-symmetric target structure and the at least an additional target structure, wherein the self-symmetric structure is invariant to N degree rotation about the common center of symmetry, wherein the at least an additional target structure is invariant to M degree rotation about the individual center of symmetry.

In another aspect, the imaging overlay target may include, but is not limited to, a self-symmetric target structure including one or more pattern elements; a first additional target structure including one or more pattern elements; at least a second additional target structure including one or more pattern elements, wherein the one or more pattern elements of the first additional target structure are contained within a boundary defined by the self-symmetric target structure, wherein the one or more pattern elements of the at least a second additional target structure are contained within a boundary defined by the first additional target structure, wherein the self-symmetric target structure is characterized by a composite exterior region of interest, wherein the composite exterior region of interest is formed by removing one or more exclusion zones corresponding with the one or more pattern elements of the first additional target structure from an exterior region of interest encompassing the self-symmetric target structure, wherein the first additional target structure is characterized by an additional composite region of interest, wherein the additional composite region of interest is formed by removing one or more exclusion zones corresponding with the one or more pattern elements of the at least a second additional target structure from an additional region of interest encompassing the first additional target structure, wherein the one or more pattern elements of the first additional target structure are characterized by one or more first interior regions of interest, wherein the one or more pattern elements of the at least a second additional target structure are characterized by one or more at least a second interior regions of interest, wherein the one or more first interior regions of interest and the one or more at least a second interior regions of interest are contained within the exterior region of interest, wherein the self-symmetric target structure, the first additional structure and the at least a second additional target structure are configured to share a common center of symmetry upon alignment of the self-symmetric target structure, the first additional structure and the at least a second additional target structure, wherein the self-symmetric structure is invariant to N degree rotation about the common center of symmetry, wherein the first additional target structure is invariant to M degree rotation about the individual center of symmetry, wherein the at least a second additional target structure is invariant to L degree rotation about the individual center of symmetry.

An apparatus suitable for measuring imaging overlay from an exclusion based overlay metrology target is disclosed. In one aspect, the apparatus may include, but is not limited to, an illumination source configured to generate light; one or more optical elements configured to direct a first portion of light from the illumination source along an object path to one or more exclusion based overlay metrology targets disposed on one or more specimens and a second portion of light from an illumination source along a reference path; a detector configured to collect a portion of light reflected from the exclusion based metrology target of the one or more specimens; and a computer controller communicatively coupled to the detector, wherein the computer controller is configured to: receive one or more images of the exclusion based overlay metrology target from the detector; define an exterior region of interest about a self-symmetric target structure of the exclusion based overlay metrology target; define one or more interior regions of interest about one or more pattern elements of an additional target structure of the exclusion based overlay metrology target; define one or more exclusion zones corresponding with the one or more pattern elements of the additional target structure of the exclusion based overlay metrology target; and generate a composite exterior region of interest by removing the one or more exclusion zones from the exterior region of interest.

A method for measuring imaging overlay from an exclusion based overlay metrology target is disclosed. In one aspect, the method may include, but is not limited to, receiving one or more images of an exclusion based overlay metrology target disposed on a sample; defining an exterior region of interest about a self-symmetric target structure of the exclusion based overlay metrology target; defining one or more interior regions of interest about one or more pattern elements of an additional target structure of the exclusion based overlay metrology target; defining one or more exclusion zones corresponding with the one or more pattern elements of the additional target structure of the exclusion based overlay metrology target; and generating a composite exterior region of interest by removing the one or more exclusion zones from the exterior region of interest. In a further aspect, the method may include, but is not limited to, calculating one or more metrology parameters for the self-symmetric target structure using the generated composite exterior region. In a further aspect, the method may include, but is not limited to, calculating one or more metrology parameters for the additional target structure using the defined one or more interior regions of interest.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
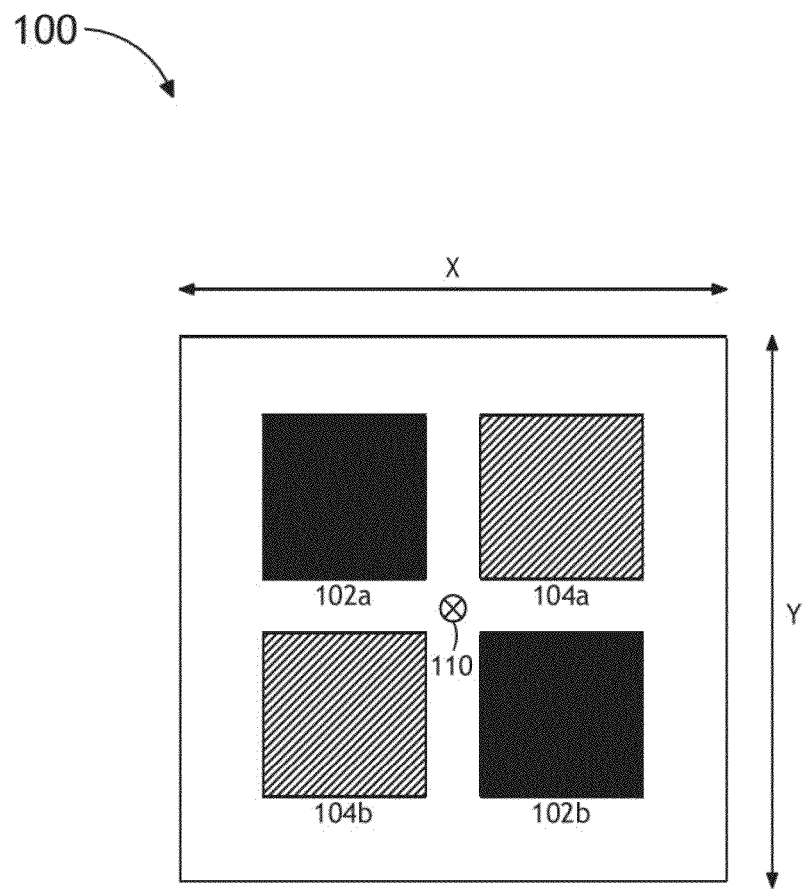
FIG. 1A is a top plan view of an imaging overlay target.
Figure 1B:
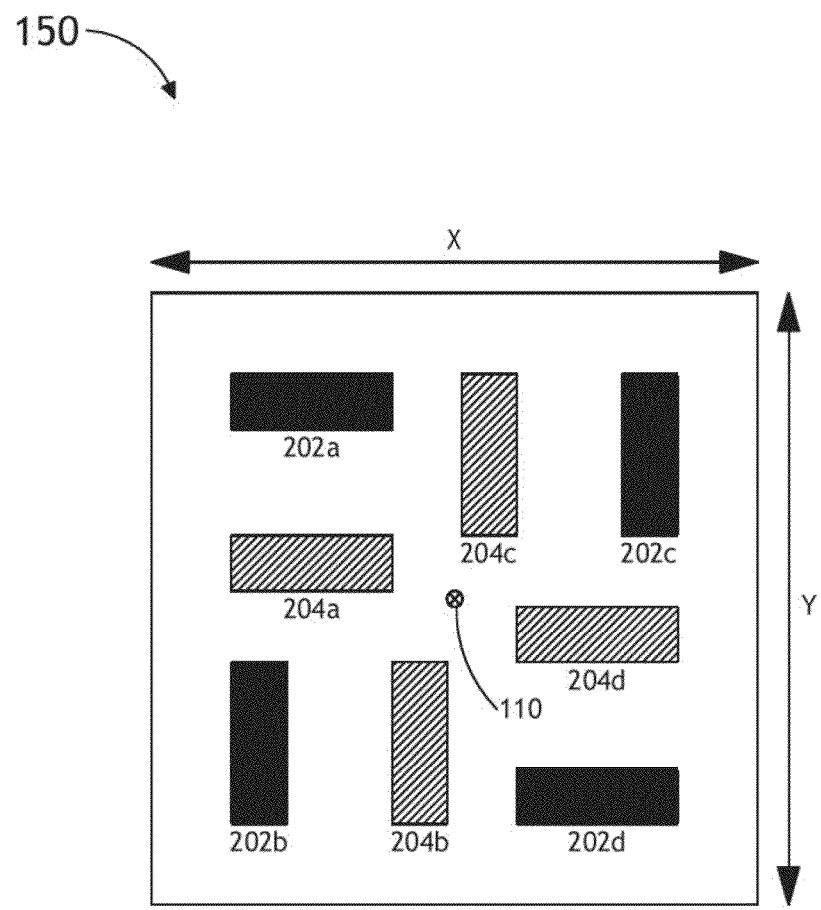
FIG. 1B is a top plan view of an imaging overlay target.

Reference will now be made in detail to the subject matter disclosed, which is illustrated in the accompanying drawings.

Referring generally to FIGS. 2A through 4, an overlay target suitable for imaging based overlay metrology is described in accordance with the present disclosure. The present invention is directed to an imaging based overlay metrology target configured with overlapping target structures. The overlapping of the target structures of the targets of the present invention aid in reducing the amount of space on a device dedicated to metrology target structures. In order to manage the possibility of optical information of an inner target structure contaminating the optical information of an encompassing outer structure, the overlay targets of the present invention are further configured for being analyzed using a "holed" composite region of interest, whereby the structures (and optical contributions thereof) of the inner target structure are negated from the region of interest associated with the outer structure. In addition, the metrology targets of the present invention are further directed to target configurations that are compatible with device processing.

In a general sense, the overlay targets of the present invention may be used to determine overlay error between two successive process layers of a semiconductor wafer. For example, an overlay target may be utilized to measure the alignment of a first semiconductor layer with respect to a second semiconductor layer, where the second layer and the first layer are disposed successively. Additionally, an overlay target may be used to determine alignment error between two structures formed on a common semiconductor layer via two or more different processes (e.g., lithographic exposures). For example, an overlay target may be utilized to measure the alignment of a first pattern with respect to a second pattern, where the first pattern and the second pattern are successive patterns formed on the same semiconductor layer.

For instance, in a measurement utilizing two or more overlay targets, an overlay target may be printed at a specific location on a first wafer layer and a second wafer layer, so that when the first and second layers are properly aligned the pattern elements of the first structure and second structure of the overlay target also align. When the first and second layers are 'mis-registered,' however, a relative shift between the pattern elements of A first structure and a second structure of a given overlay mark exists, a shift that can be measured through a variety of techniques.

The structures and pattern elements described herein may be fabricated using any process known in the art suitable for semiconductor wafer processing, such as, but not limited to, photolithographic, etching, and deposition techniques. Methods for printing overlay targets and their contained structures, pattern elements, and pattern sub-elements are described generally in U.S. application Ser. No. 11/179,819 filed on Feb. 23, 2006, and is incorporated herein by reference in its entirety.

Figure 2A:
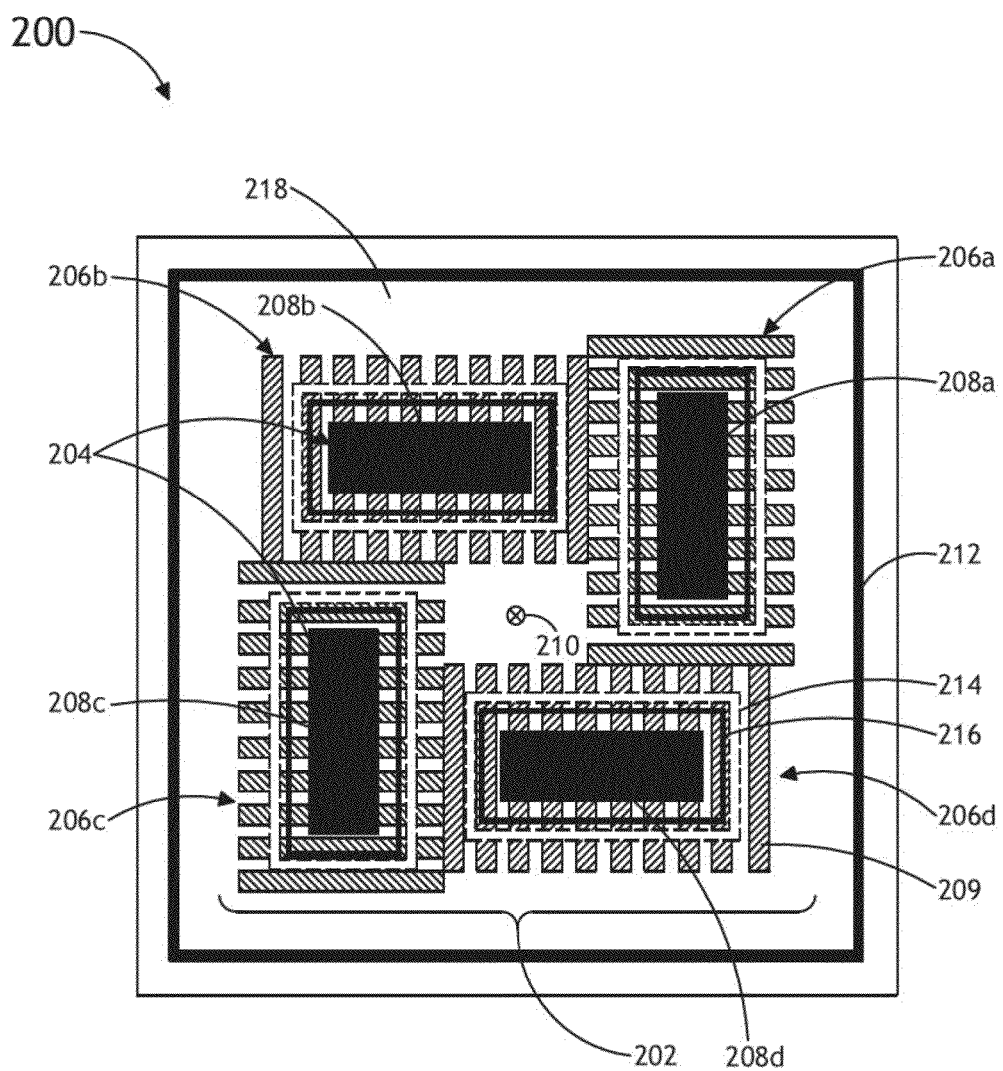
FIG. 2A is a top plan view of an exclusion based imaging overlay target, in accordance with one embodiment of the present invention.

FIG. 2A illustrates a top plan view of an exclusion based overlay target 200 suitable for imaging based metrology, in accordance with one embodiment of the present invention. In one aspect, the overlay target 200 may include a self-symmetric target structure 202 formed on a first process layer and an additional target 204 structure formed on a second process layer. In another aspect of target structure 200, the self-symmetric structure 202 and the additional target structure 204 overlap. It is noted herein that the overlapping of target structures 202, 204 reduces the amount of space needed for the target 200.

In another aspect of target 200, each of the target structures 202, 204 of the overlay target 200 includes two or more pattern elements. In a further aspect of target 200, each of the pattern elements of the at least an additional target structure 204 are contained within a boundary defined by one of the pattern elements of the self-symmetric target structure 202. In this regard, each of the pattern elements of the additional target structure 204 may be arranged to overlap a pattern element of the symmetric-structure, as illustrated in FIG. 2A.

In another aspect of target 200 of the present invention, the self-symmetric target structure 202 and the additional target structure 204 are designed such that each is invariant to a selected rotation about a common center of symmetry 210. In one embodiment, as shown in FIG. 2A, upon rotating the self-symmetric target structure 202 and/or the additional target structure 204 about the common center of symmetry 210 by 90 degrees, the top view image of the structures remains identical to the top view image of the structures prior to rotation. Resultantly, it will be recognized by those skilled in the art that the overall target, consisting of the multiple individual structures, is invariant to a 90 degree rotation about the common center of symmetry 210 when properly aligned.

Figure 2B:
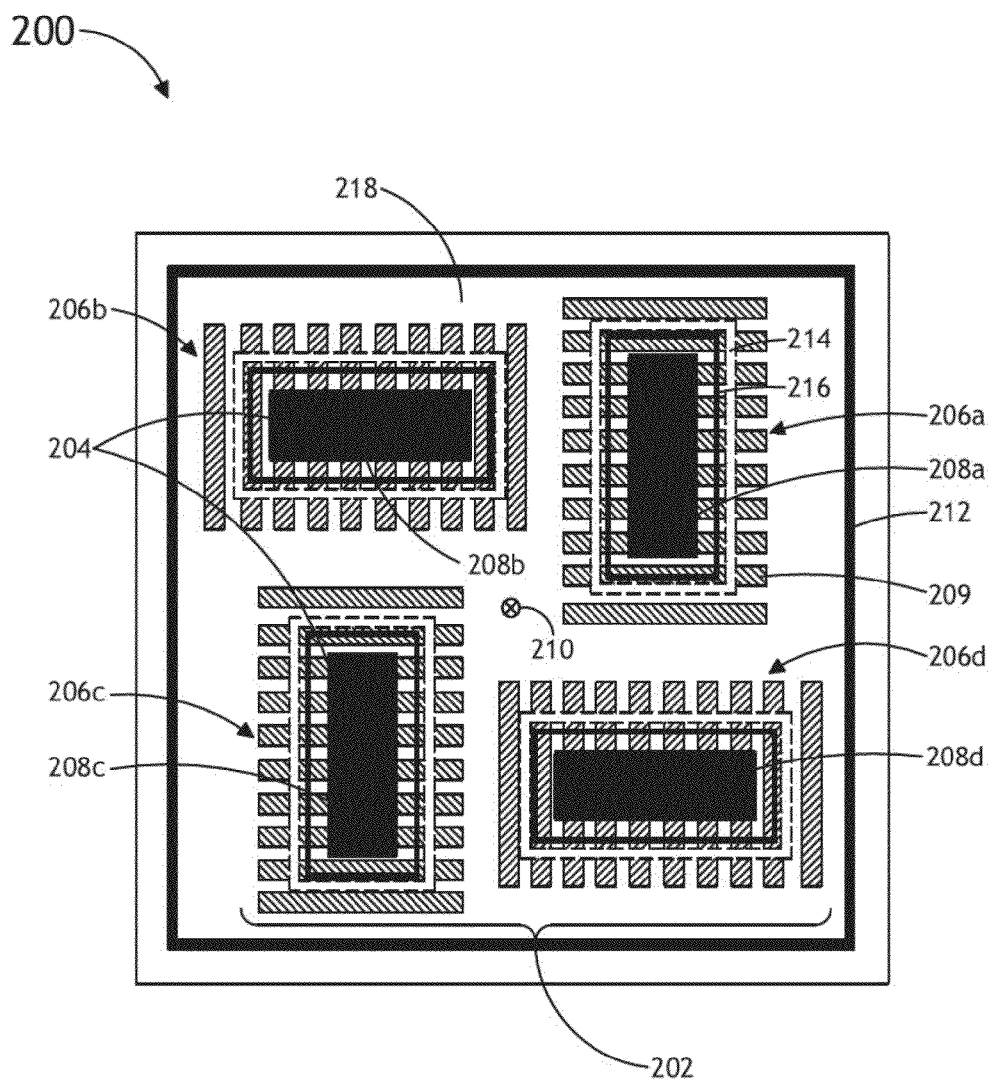
FIG. 2B is a top plan view of an exclusion based imaging overlay target, in accordance with one embodiment of the present invention.
Figure 2C:
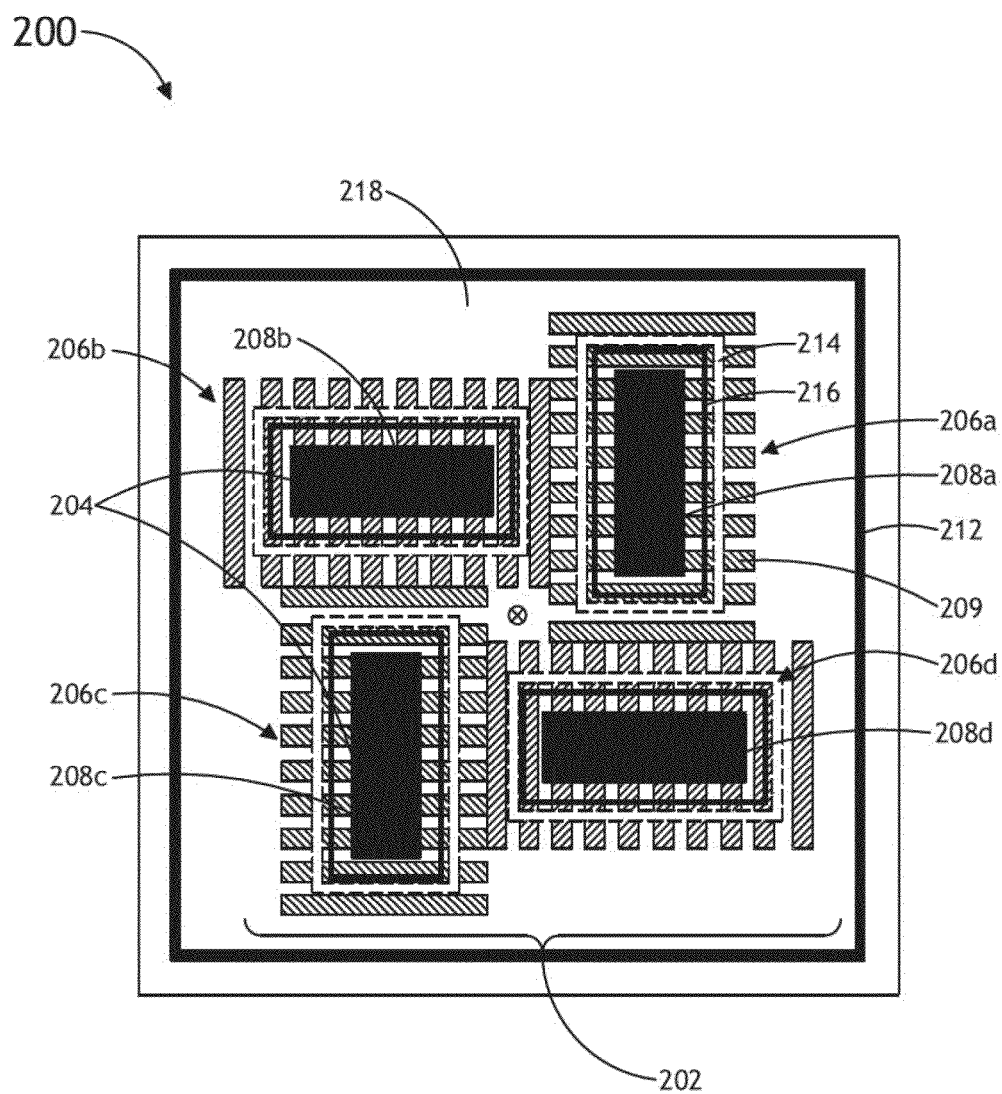
FIG. 2C is a top plan view of an exclusion based imaging overlay target, in accordance with one embodiment of the present invention.
Figure 2D:
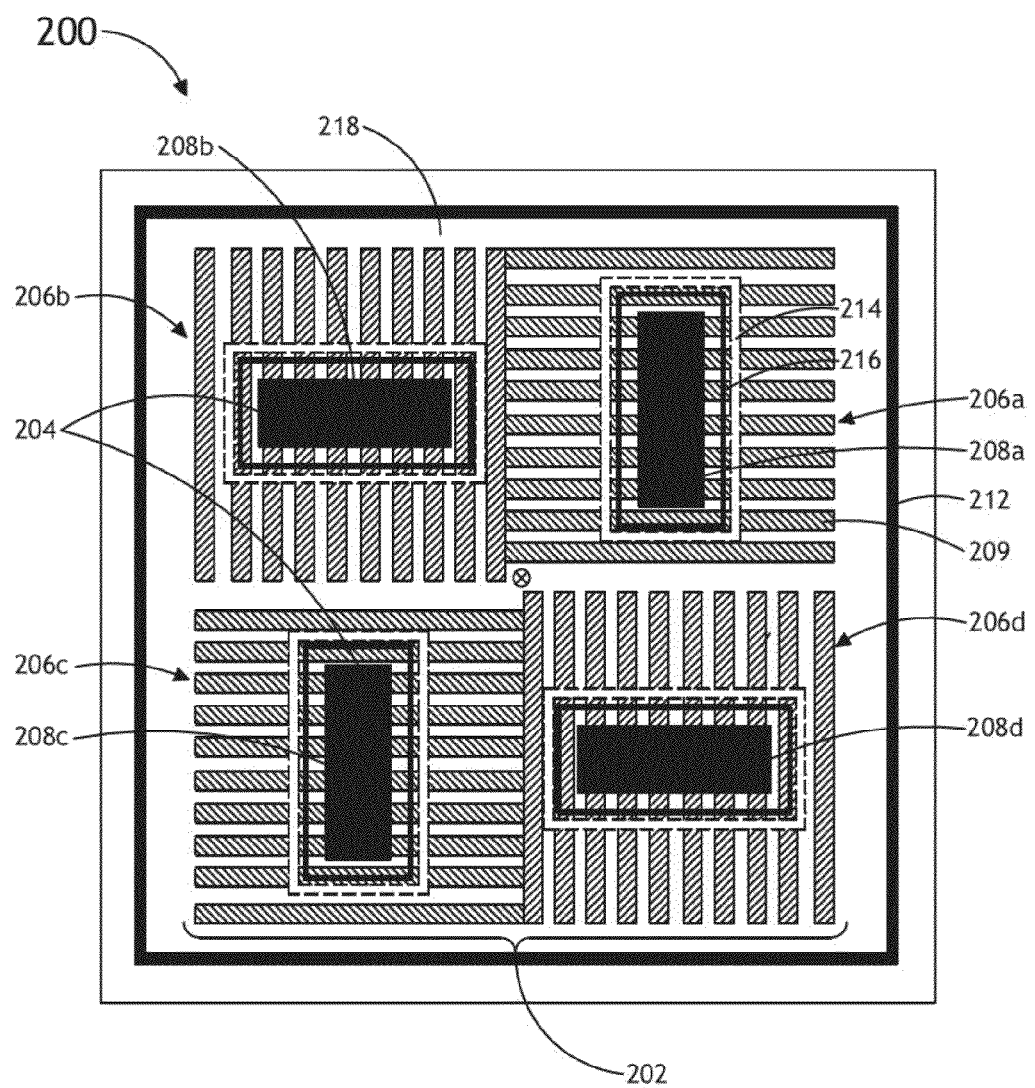
FIG. 2D is a top plan view of an exclusion based imaging overlay target, in accordance with one embodiment of the present invention.
Figure 2E:
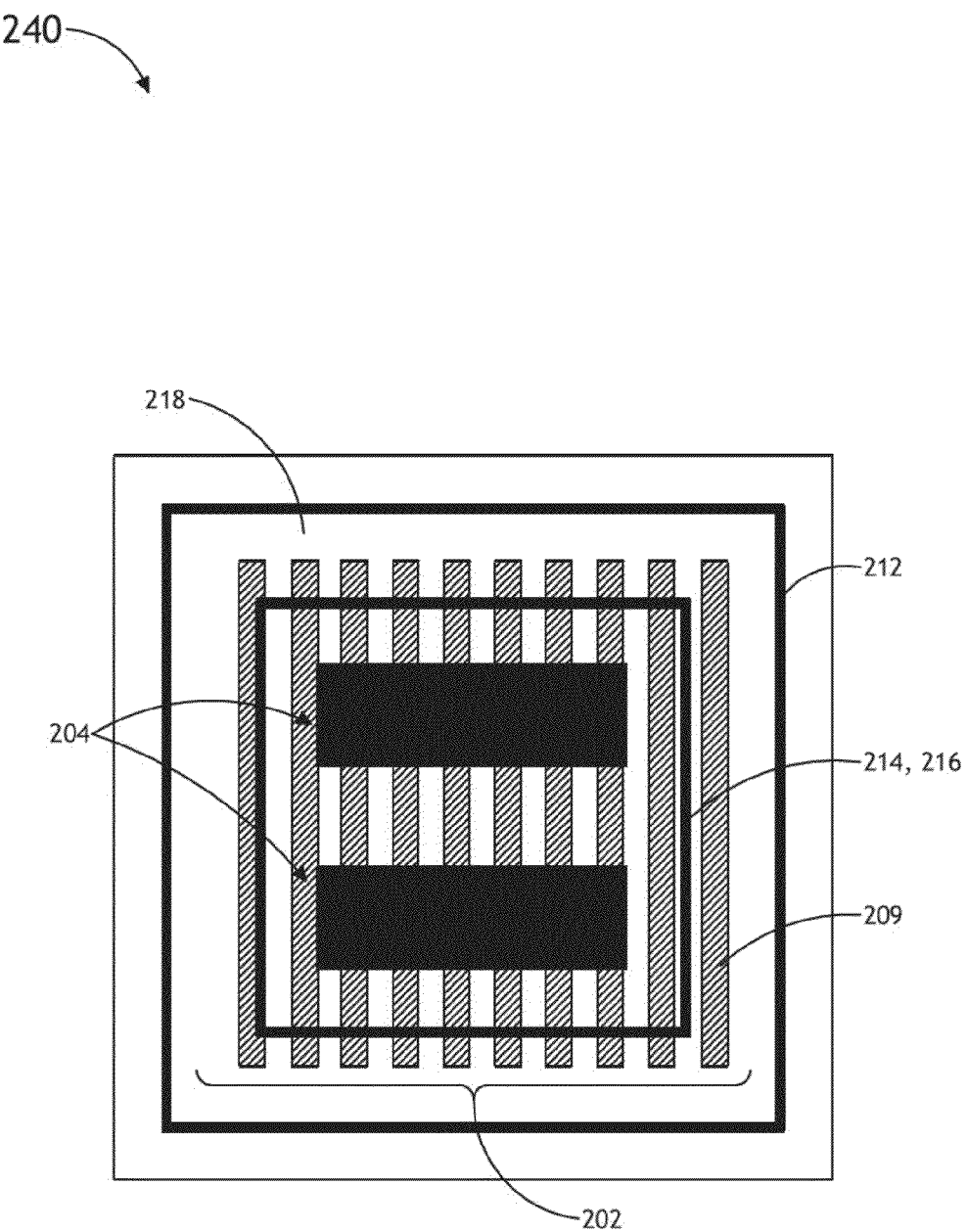
FIG. 2E is a top plan view of an exclusion based imaging overlay target, in accordance with one embodiment of the present invention.

In another embodiment, as discussed further herein and shown in FIG. 2E, upon rotating the self-symmetric target structure 202 and/or the additional target structure 204 about the common center of symmetry 210 by 180 degrees, the top view image of the structures remains identical to the top view image of the structures prior to rotation. Resultantly, it will be recognized by those skilled in the art that the overall target, consisting of the multiple individual structures, is invariant to a 180 degree rotation about the common center of symmetry 210 when properly aligned.

It should be recognized that while the self-symmetric structure 202 and the additional structure 204 share a common center of symmetry by design when the corresponding layers are properly aligned, upon misalignment between layers, the self-symmetric structure 202 and the additional structure 204 may shift with respect to one another. As a result of this misalignment, the center of symmetry of the self-symmetric structure 202 and the center of symmetry of the additional structure 204 will shift and the center of symmetries of the self-symmetric structure 202 and the additional structure 204 will no longer coincide. It is recognized that this concept may be extended to all of the structures within a given target of the present invention. It is the measurement of this shift between centers of symmetries of various structures of a target 200 which enables the overlay measurement.

In another aspect of the present invention, the self-symmetric target structure 202 is characterized by a composite exterior region of interest (ROI) 218. In one embodiment, the composite exterior ROI 218 is formed by removing two or more exclusion zones 216 corresponding with the two or more pattern elements of the at least an additional target structure 204 from an exterior ROI 212 that encompasses the self-symmetric target structure 202. For example, in the case of target 200, the composite exterior ROI 218 is formed by removing the four exclusion zones 216 (black rectangles) that encompass the pattern elements 208a-208d of the additional target structure 204 from the exterior ROI 212. It is noted herein that the regions of the target 200 occupied by the additional target structure 204 are removed (by corresponding metrology tool computer controller) to form the composite exterior structure 218 in order to avoid optical information from the additional structure 204 from mixing with the optical information associated with the self-symmetric structure 202. In this regard, the composite exterior ROI 218 may be used in one or more ROI calculations for the self-symmetric target structure 202, as will be described in greater detail further herein. For example, the generated composite exterior ROI 218 may then be used to find the symmetry point of the self-symmetric target structure 202.

In another aspect of the present invention, the pattern elements of the additional target structure 204 are characterized by a set of interior ROIs 214. In this regard, each pattern element of the additional target structure 204 is characterized with a single ROI 214. In another embodiment, the set of interior ROIs 214 are contained with the exterior region of interest 212. In a further aspect, the interior ROIs 214 may be used in one or more ROI calculations for the additional target structure 204. For example, the interior ROIs 214 may be used to find the symmetry point of the additional target structure 204. It is recognized that any ROI calculation method known in the art may be extended to the ROI calculation for the interior ROIs 214 of the additional target structure 204.

In one embodiment, the defined interior regions of interest 214 may be coextensive with the defined exclusion zones 216. In this regard, the defined interior regions of interest may 214 effectively serve as the exclusion zones 216 (see FIGS. 2E-2G). In another embodiment, the defined interior regions of interest 214 may be sized and arranged such that they are not coextensive with the defined exclusion zones 216 (see FIGS. 2A-2D).

Note that for the purposes of this disclosure textured and/or shaded patterns in FIG. 2A (and figures throughout this disclosure) are used to represent the different target structures of a target, wherein pattern elements belonging to the same target structure have the same texture and/or shade. The texture patterns displayed in the various figures of the present disclosure should not be interpreted as limiting as the selected texture pattern is not representative of a structural aspect of the associated pattern element, but is merely utilized to represent pattern elements of the same target structure.

In one embodiment, as shown in FIG. 2A, the self-symmetric target structure 202 includes a set of pattern elements. For example, the self-symmetric target 202 may include a set of pattern elements 206a, 206b, 206c and 206d (cross-hatched shading). In one embodiment, as shown in FIG. 2A, each of the pattern elements 206a-206d may include a set of pattern sub-elements. In a further embodiment, the set of pattern sub-elements 209 may form a periodic pattern. In this regard, each of the pattern elements 206a-206d may be segmented. For instance, the segmented pattern elements of self-symmetric target structure 202 may include a series of parallel aligned 'thin' rectangular sub-elements 209. It is recognized herein that the segmentation of a pattern element of the self-symmetric target structure 202 allows for reliable overlay measurements along the direction of segmentation of the given pattern element. As such, in order to measure overlay along two orthogonal directions (e.g., X- and Y-directions) segmented pattern elements are needed for both orthogonal directions. For instance, as shown in FIG. 2A, segmented pattern elements 206a and 206c may be used to measure overlay in a first direction, while segmented pattern elements 206b and 206d may be used to measure overlay in a second direction orthogonal to the first direction.

Figure 2F:
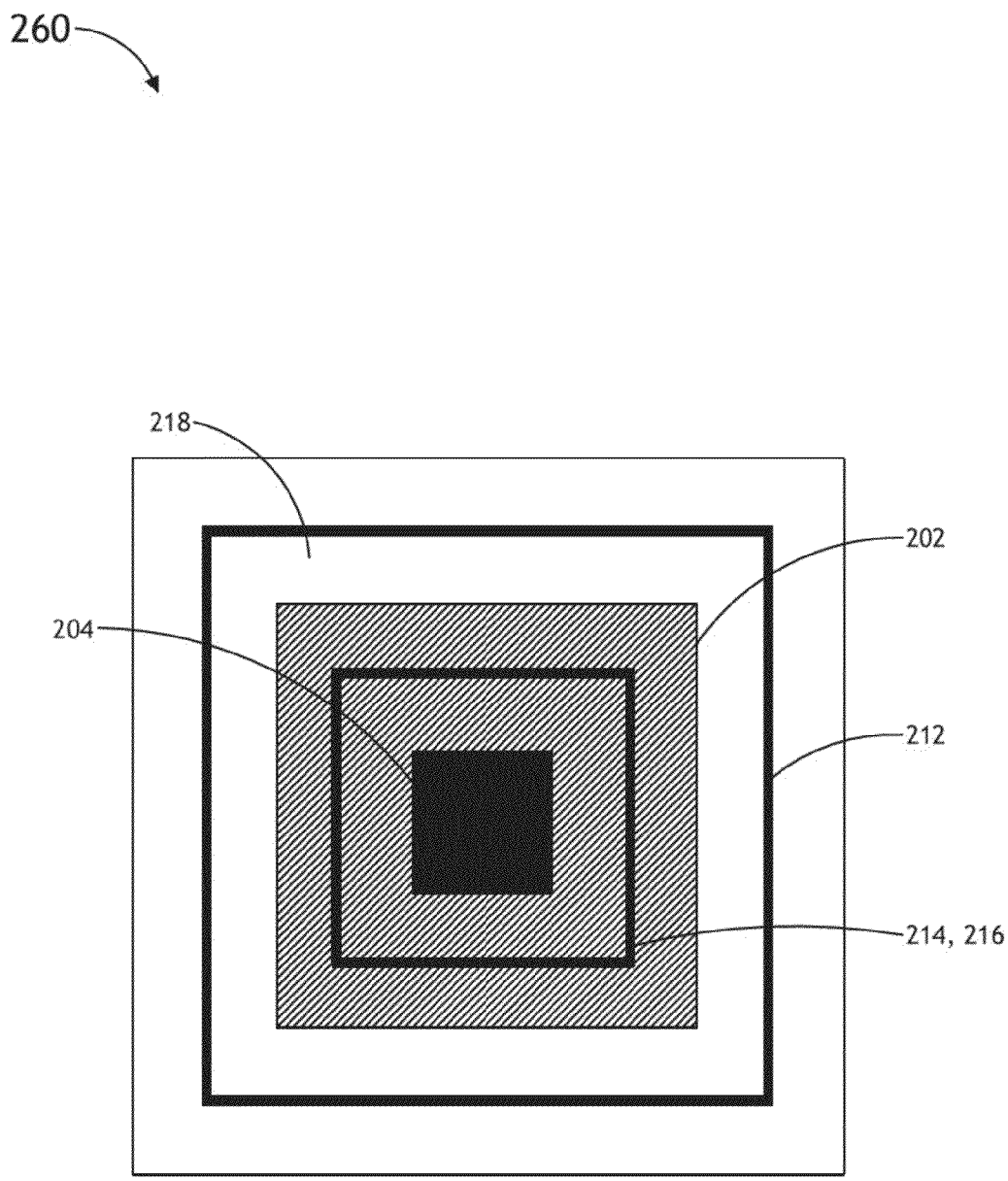
FIG. 2F is a top plan view of an exclusion based imaging overlay target, in accordance with one embodiment of the present invention.

In another embodiment, each of the pattern elements 206a-206d may be non-segmented as discussed further herein (see FIG. 2F).

In another embodiment, as shown in FIG. 2A, the additional target structure 204 includes a set of pattern elements. For example, the additional target structure 204 may include a set of pattern elements 208a, 208b, 208c and 208d (solid shading). In one aspect, the pattern elements 208a-208d are each arranged to overlap one of the pattern elements 206a-206d of the self-symmetric structure 202. For example, pattern element 208a overlaps 206a, pattern element 208b overlaps 206b, pattern element 208c overlaps 206c and pattern element 208d overlaps 206d.

It is noted herein that the number of pattern elements depicted in the self-symmetric structure 202 and the additional structure 204 are not limiting. Rather, FIG. 2A is provided merely for illustrative purposes. More generally, a the self-symmetric structure 202 and the additional structure 204 of target 200 may each contain from two pattern elements up to and including an Nth pattern element.

In another embodiment, a first pattern element of the self-symmetric target structure 202 is suitable for overlay measurement in a first direction, while at least a second pattern element of the self-symmetric target structure 202 is suitable for overlay measurement in a second direction. In a further embodiment, the first direction includes the X-direction, while the second direction includes the Y-direction. In another embodiment, a first pattern element of the additional target structure 204 is suitable for overlay measurement in a first direction, while at least a second pattern element of the additional target structure 204 is suitable for overlay measurement in a second direction. In a further embodiment, the first direction includes the X-direction, while the second direction includes the Y-direction. It is recognized that a design such as this allows for the simultaneous acquisition of X-overlay and Y-overlay data in a single "image grab." Moreover, it is further recognized that the design depicted in FIG. 2A may allow for compatibility with presently existing metrology tool procedures and architectures.

In another embodiment, although not shown, one or more of the pattern elements 208a-208d of the additional target structure 204 may be segmented (not shown) in a manner similar to the segmentation of pattern elements 206a-206d of the self-symmetric structure 202. For example, each of the pattern elements 208a-208d may include a set of pattern sub-elements (not shown). In a further embodiment, the set of pattern sub-elements (not shown) may form a periodic pattern. In this regard, each of the pattern elements 208a-208d is said to be segmented. For instance, the segmented pattern elements of the additional target structure 204 may include a series of parallel aligned 'thin' rectangular sub-elements.

FIGS. 2B-2D illustrate top plan views of an exclusion based overlay target 200 suitable for imaging based metrology, in accordance with an alternative embodiments of the present invention. For example, FIGS. 2B and 2C depict exclusion based overlay targets having a spatial arrangement of pattern elements 206a-206d of the self-symmetric structure 202 that differs from the arrangement of pattern elements 206a-206d of FIG. 2A. By way of further example, FIG. 2D depicts an exclusion based overlay target having pattern elements 206a-206d of the self-symmetric structure 202 that are larger than the pattern elements 206a-206d of FIG. 2A-2C. It is recognized herein that the depicted spatial arrangements provided in FIGS. 2A-2D is not limited and are provided merely for illustration.

FIG. 2E illustrates a top plan view of an exclusion based overlay target 240 suitable for imaging based metrology, in accordance with an alternative embodiment of the present invention. The embodiments, configurations, and applications described throughout the present disclosure with respect to FIGS. 2A-2D, 2F-2H and 3 should be interpreted to extend to the embodiment of FIG. 2E and like embodiments. In one embodiment, the exclusion based overlay target 240 of the present invention may include a single pattern self-symmetric structure 202 having multiple sub-elements 209 (e.g., periodic sub-elements 209). In another embodiment, the exclusion based overlay target 240 of the present invention may include an additional target structure 204 having multiple pattern elements (e.g., black horizontal bars in FIG. 2E).

FIG. 2F illustrates a top plan view of an exclusion based overlay target 240 suitable for imaging based metrology, in accordance with an alternative embodiment of the present invention. The embodiments, configurations, and applications described throughout the present disclosure with respect to FIGS. 2A-2E, 2G-2H and 3 should be interpreted to extend to the embodiment of FIG. 2F and like embodiments. In one embodiment, the exclusion based overlay target 260 of the present invention may include a single pattern element self-symmetric structure 202 (e.g., hatched square in FIG. 2F). In another embodiment, the exclusion based overlay target 260 of the present invention may include a single pattern element additional target structure 204 (e.g., black square in FIG. 2F).

Figure 2G:
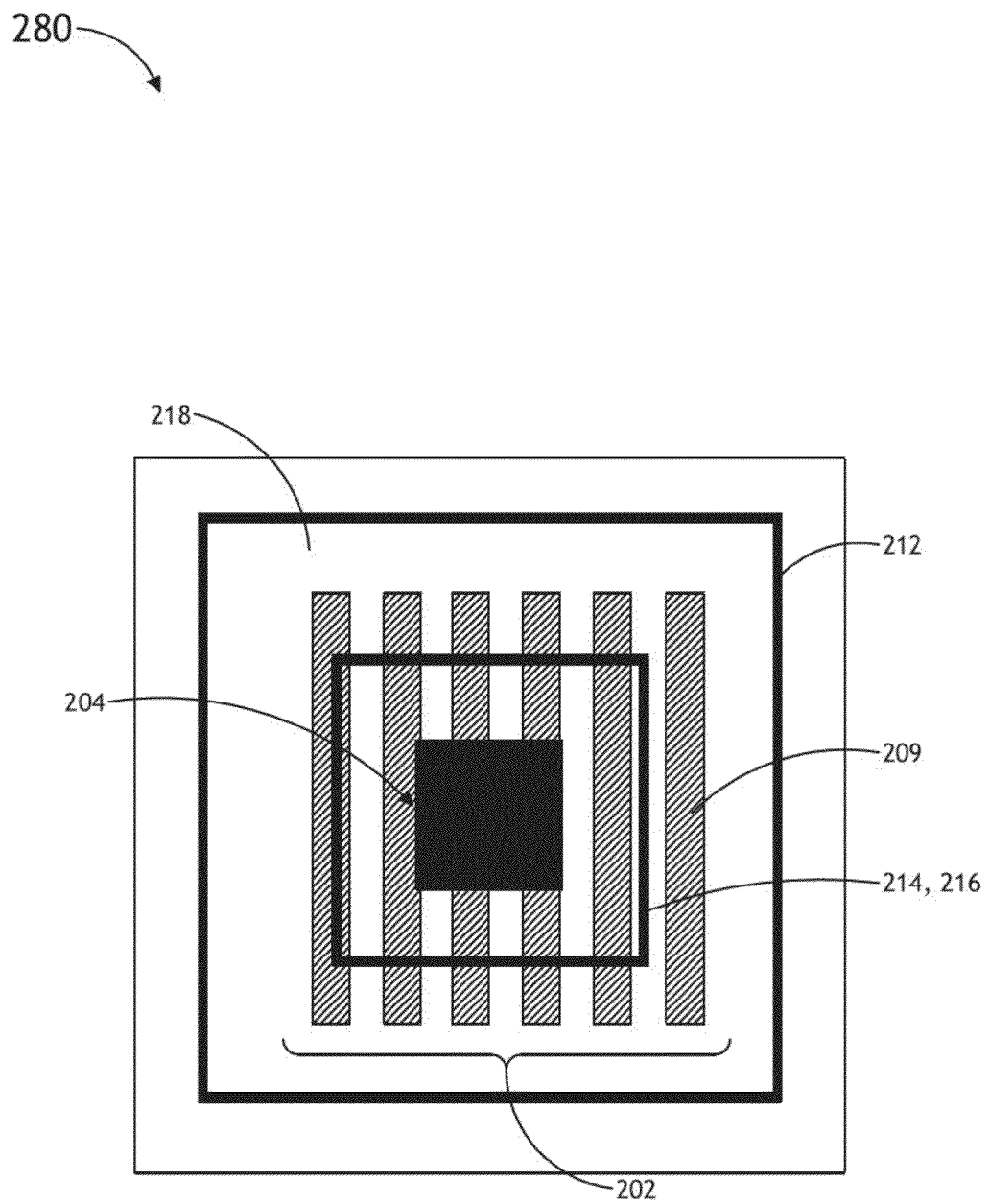
FIG. 2G is a top plan view of an exclusion based imaging overlay target, in accordance with one embodiment of the present invention.

FIG. 2G illustrates a top plan view of an exclusion based overlay target 240 suitable for imaging based metrology, in accordance with an alternative embodiment of the present invention The embodiments, configurations, and applications described throughout the present disclosure with respect to FIGS. 2A-2F, 2H and 3 should be interpreted to extend to the embodiment of FIG. 2G and like embodiments. In one embodiment, the exclusion based overlay target 280 of the present invention may include a single pattern self-symmetric structure 202 having multiple sub-elements 209 (e.g., periodic sub-elements 209). In another embodiment, the exclusion based overlay target 280 of the present invention may include a single pattern element additional target structure 204 (e.g., black square in FIG. 2F).

Figure 2H:
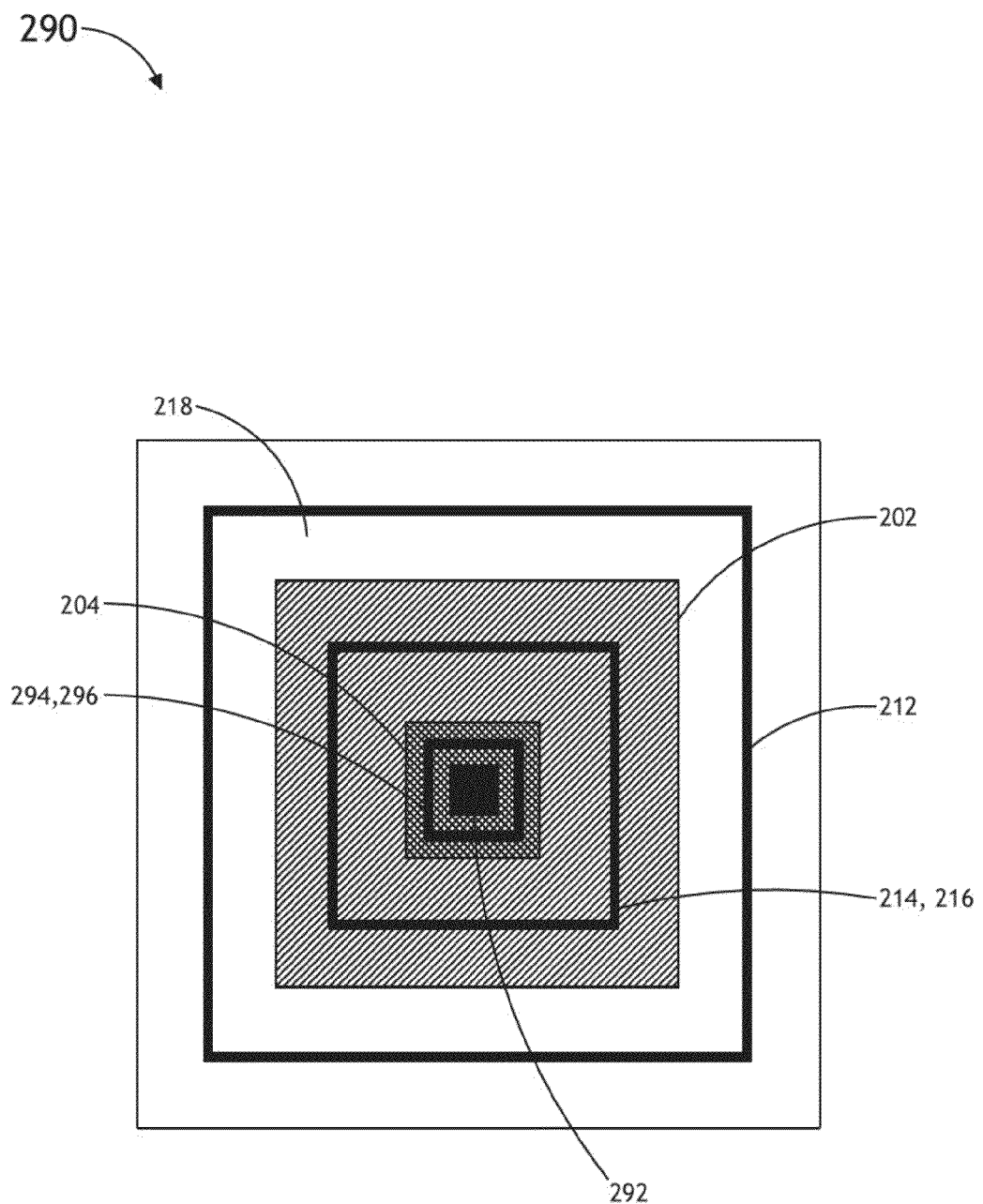
FIG. 2H is a top plan view of an exclusion based imaging overlay target, in accordance with one embodiment of the present invention.

FIG. 2H illustrates a top plan view of an exclusion based overlay target 290 suitable for imaging based metrology, in accordance with an alternative embodiment of the present invention. The embodiments, configurations, and applications described throughout the present disclosure with respect to FIGS. 2A-2G and 3 should be interpreted to extend to the embodiment of FIG. 2H and like embodiments. In one aspect, the overlay target 290 is an overlapping multi-layer overlay target 290. The multi-layer overlay target 290 consists of a three or more target structure extension of the embodiments described previously herein.

In one embodiment, the overlay target 290 includes a self-symmetric target structure 202, a first additional target structure 204 and a second additional target structure 292. It is noted herein that the overlapping multi-layer overlay target 290 may include any number of target structures and the depicted number of three target structures in FIG. 2H is not limiting a should be interpreted as merely illustrative. It is recognized that up to and include N tiered overlapping target structures may be included in the overlapping multi-layer overlay target structure 290.

In another embodiment, each of the target structures, self-symmetric target structure 202, the first additional target structure 204 and at least second additional target structure 292, of the target 290 may be formed on different process layers of the given semiconductor device/wafer. In this regard, the self-symmetric target structure 202 may be formed on a first layer, the first additional target structure 204 may be formed on a second layer and a second additional target structure 292 may be formed on a third layer of the given device.

In another aspect of target 290, each of the target structures 202, 204 and 292 of the overlay target 292 includes one or more pattern elements (one pattern element embodiment is shown in FIG. 2H). In a further aspect of target 290, the pattern elements of the first additional target structure 204 are contained within a boundary defined by one of the pattern elements of the self-symmetric target structure 202. Further, each of the pattern elements of the first additional target structure 204 may be arranged to overlap a pattern element of the self-symmetric structure 202. As illustrated in FIG. 2H, the single element first additional target structure 204 may overlap the single element self-symmetric structure 202. In another embodiment, each of the pattern elements of the at least a second target structure 292 may be arranged to overlap a pattern element of the first additional target structure 204. As illustrated in FIG. 2H, the single element at least a second target structure 292 overlaps the single element first additional target structure 204 (which in turn overlaps the self-symmetric target structure 202). While the embodiment shown in FIG. 2H depicts single pattern element target structures in the case of structures 202, 204 and 292, it is noted herein that the present invention is extendable to the case where one or all of the target structures 202, 204 and 292 (and targets structures up to an including an Nth target structure) may include multiple pattern elements (not shown in FIG. 2H). As such, the single pattern element embodiment of FIG. 2H should not be interpreted as limiting and it is provided merely for illustrative purposes. In this regard, the constituent pattern elements of the first additional target structure 204 may overlap the pattern elements of the self-symmetric target structure 202 (as previously described herein), the constituent pattern elements of the at least a second target structure 292 may overlap the pattern elements of the first additional target structure 204 and so on.

In another aspect of target 290 of the present invention, the self-symmetric target structure 202, the first additional target structure 204 and the at least a second additional target structure 292 are designed such that each is invariant to a selected rotation about a common center of symmetry 210. In one embodiment, as shown in FIG. 2H, upon rotating the self-symmetric target structure 202, the first additional target structure 204 and/or the at least a second additional target structure 292 about the common center of symmetry by 90 degrees, the top view image of the structures remains identical to the top view image of the structures prior to rotation. Resultantly, it will be recognized by those skilled in the art that the overall target, consisting of the multiple individual structures, is invariant to a 90 degree rotation about the common center of symmetry when properly aligned.

In another aspect of the present invention, the self-symmetric target structure 202 is characterized by a composite exterior region of interest (ROI) 218. In one embodiment, the composite exterior ROI 218 is formed by removing one or more exclusion zones 216 corresponding with the one or more pattern elements of the first additional target structure 204 from an exterior ROI 212 that encompasses the self-symmetric target structure 202, as described previously herein. In this regard, the composite exterior ROI 218 may be used in one or more ROI calculations for the self-symmetric target structure 202, as will be described in greater detail further herein. For example, the generated composite exterior ROI 218 may then be used to find the symmetry point of the self-symmetric target structure 202.

In another embodiment, the composite exterior ROI 218 is formed by removing one or more exclusion zones 216 corresponding with the one or more pattern elements of the first additional target structure 204 from an exterior ROI 212 that encompasses the self-symmetric target structure 202, as described previously herein. In this regard, the composite exterior ROI 218 may be used in one or more ROI calculations for the self-symmetric target structure 202, as will be described in greater detail further herein. For example, the generated composite exterior ROI 218 may then be used to find the symmetry point of the self-symmetric target structure 202.

In another aspect of the present invention, the pattern elements of the first additional target structure 204 are characterized by one or more first interior ROIs 214. In this regard, each pattern element (a single pattern element in FIG. 2H) of the additional target structure 204 is characterized with a single ROI 214.

In one embodiment, the defined first interior regions of interest 214 may be coextensive with the defined exclusion zones 216. In this regard, the defined first interior regions of interest 214 may effectively serve as the exclusion zones 216 (see FIGS. 2E-2H).

In another aspect of the present invention, the first additional target structure 204 is characterized by an additional composite region of interest. In one embodiment, the additional composite region of interest is formed by removing one or more exclusion zones 296 corresponding with the one or more pattern elements (may be coextensive with the additional interior regions of interest 294) of the at least a second additional target structure 292 from an additional ROI that encompasses the first additional target structure 204. For example, in the single pattern case of FIG. 2H, the additional ROI of interest encompassing the first additional target structure 292 may consist of the first interior region of interest 214. It is noted, however, the additional ROI may encompass multiple pattern elements in a manner similar to that described for the self-symmetric target structure 202 and the exterior region of interest 212. In this regard, the additional composite ROI (e.g., ROI 214 in the case of a single pattern element structure 204) may be used in one or more ROI calculations for the first additional target structure 204 in a manner similar to the calculation for the self-symmetric structure 202, as will be described in greater detail further herein.

In another embodiment, the composite additional ROI associated with the first additional structure 204 is formed by removing one or more exclusion zones 296 corresponding with the one or more pattern elements of the at least a second additional target structure 2292 from the additional ROI (e.g., ROI 214 in the case of a single pattern element structure) that encompasses the first additional structure 204. In this regard, the additional composite region of interest may be used in one or more ROI calculations for the first additional target structure 204. For example, the generated additional composite region of interest may then be used to find the symmetry point of the first additional target structure 204. It is recognized herein that this procedure may be carried out in a manner similar to that executed for finding the symmetry point for the self-symmetric target structure 202.

In another aspect of the present invention, the pattern elements of the at least a second additional target structure 292 are characterized by one or more second interior ROIs 294. In a further aspect, the one or more at least a second interior ROIs 294 may be used in one or more ROI calculations for the at least a second additional target structure 294. For example, the second interior ROIs 294 may be used to find the symmetry point of the second additional target structure 294. It is recognized that any ROI calculation method known in the art may be extended to the ROI calculation for the interior ROIs 294 of the at least a second additional target structure 294.

Figure 3:
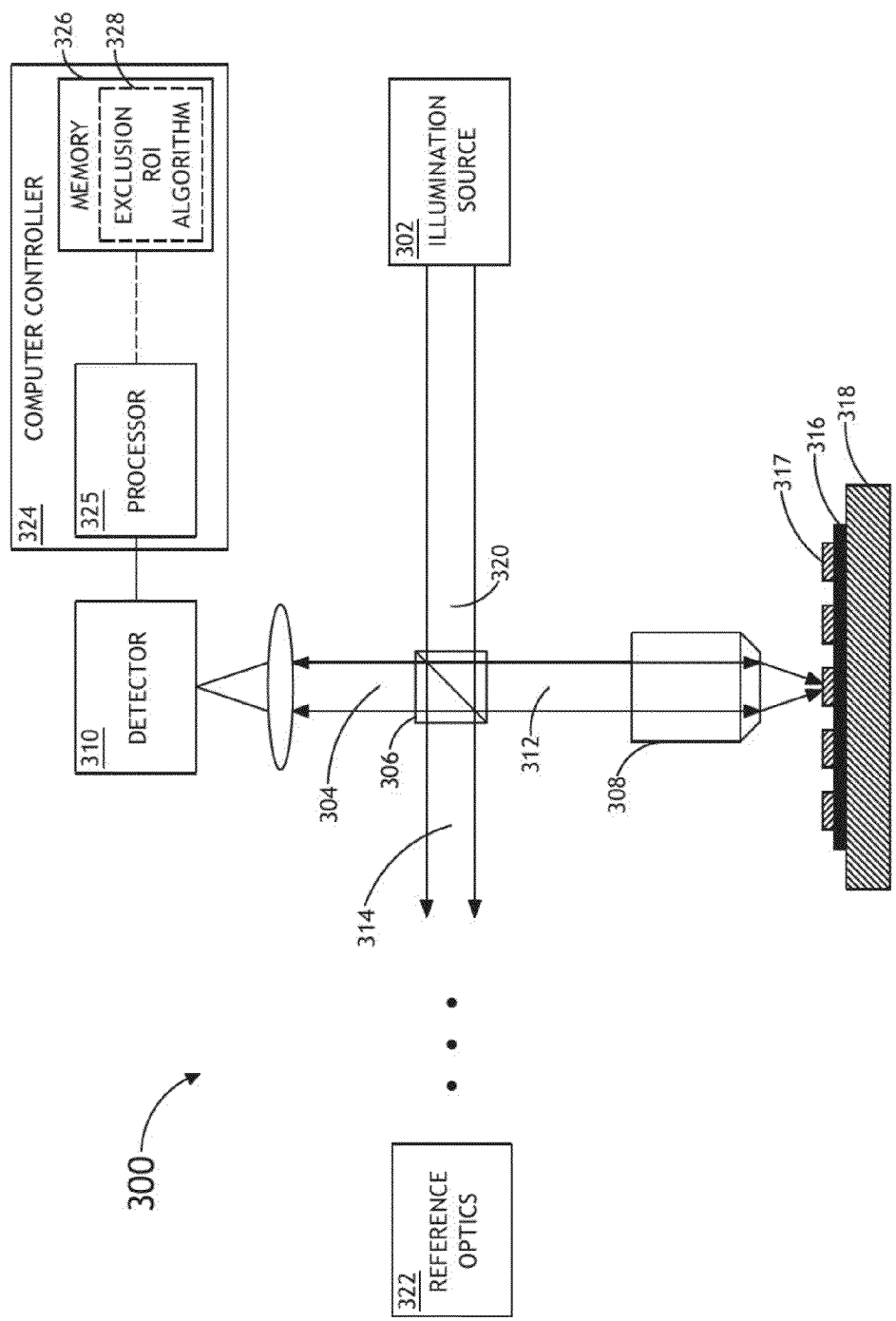
FIG. 3 is a block diagram view of a system suitable for measuring imaging overlay from an exclusion based overlay metrology target, in accordance with one embodiment of the present invention.

Referring generally to FIG. 3, the system 300 suitable for exclusion ROI based imaging overlay metrology is described in accordance with the present invention. It is contemplated herein that system 300 of the present invention may enable the implementation of the various exclusion based overlay metrology targets described previously herein. In this regard, the system 300 is suitable for implementing targets 200, 240, 260, 280 and 290 described previously herein. It is contemplated herein that the system 300 of the present invention may consist (but not required to consist) of adapting or reconfiguring presently existing optical metrology systems (e.g. KLA-Tencor Archer 100 overlay control system). In addition, it is anticipated that the present invention may be extended to a wide variety of microscopy and overlay metrology systems.

Measurement and calculation techniques extendable to target 200, 240, 260, 280 and 290 described herein are described in U.S. applications Ser. No. 11/830,782 filed on Jul. 30, 2007, and Ser. No. 11/179,819 filed on Jul. 11, 2005, and are incorporated herein by reference.

In one aspect of the present invention, the system 300 suitable for exclusion ROI based imaging overlay metrology may include an illumination source 302 configured to generate light, a detector 310 configured to collect light reflected from an exclusion based metrology target 317 (e.g., target 200, target 240, target 260, target 280 and target 290 described previously herein) of one or more specimens 316 (e.g., one or more wafers of a wafer lot) and one or more optical elements (e.g., beam splitter 306). In one embodiment, the one or more optical elements (e.g., beam splitter 306 and the like) are configured to direct a first portion of light from the illumination source 302 along an object path 312 to one or more exclusion based overlay metrology targets 317 disposed on one or more process layers of specimen 316 and a second portion of light from an illumination source 302 along a reference path 314.

In another aspect of the present invention, the system 300 may include a computer controller 324 communicatively coupled to detector 310. In one embodiment, the computer controller 324 may include one or more processors 325. The computer controller 324 may further include a non-transitory memory medium 326 (i.e., storage medium) containing program instructions configured to cause the one or more processors of the controller 324 to carry out the various steps described through the present disclosure. In another embodiment, the one or more processors 325 of the controller 324 may be coupled to a user interface (not shown).

In general, the term "processor" may be broadly defined to encompass any device having one or more processors, which execute instructions from a memory medium. In this sense, the one or more processors 325 may include any microprocessor-type device configured to execute software algorithms and/or instructions. In one embodiment, the one or more processors 325 may consist of a desktop computer or other computer system (e.g., networked computer) configured to execute a program configured to carry out the exclusion based algorithm 328 of system 300, as described throughout the present disclosure. It should be recognized that the steps described throughout the present disclosure may be carried out by a single computer system or, alternatively, multiple computer systems. Moreover, different subsystems of the system 300, such as a user interface (not shown), may include processor or logic elements suitable for carrying out at least a portion of the steps described above. Therefore, the above description should not be interpreted as a limitation on the present invention but merely an illustration.

In a further aspect of the present invention, the one or more processors 325 of the computer controller 324 are configured to execute an exclusion based ROI algorithm 328 maintained in a memory medium 326. In one embodiment, the one or more processors 325 of the computer controller 324 may be configured to receive one or more images of the exclusion based overlay metrology target from the detector 310. In another embodiment, the one or more processors 325 of the computer controller 324 may be configured to define an exterior region of interest 312 about a self-symmetric target structure 202 of the exclusion based overlay metrology target 317, such as targets 200, 240, 260, 280 and 290. In another embodiment, the one or more processors 325 of the computer controller 324 may be configured to define one or more interior regions of interest 214 about one or more pattern elements, such as pattern elements 208a-208d, of an additional target structure 204 of the exclusion based overlay metrology target 317. In another embodiment, the one or more processors 325 of the computer controller 324 may be configured to define one or more exclusion zones 216 corresponding with the one or more pattern elements of the additional target structure 204 of the exclusion based overlay metrology target 317. In some embodiments, the defined interior regions of interest 214 may be coextensive with the defined exclusion zones 216. In this regard, the defined interior regions of interest may 214 effectively serve as the exclusion zones 216 (as shown in FIG. 2E-2G). In other embodiments, the defined interior regions of interest 214 may be sized and arranged such that they are not coextensive with the defined exclusion zones 216 (as shown in FIG. 2A-2D).

In another embodiment, the one or more processors 325 of the computer controller 324 may be configured to generate a composite exterior region of interest 218 by removing the one or more exclusion zones 216 from the exterior region of interest 212. In this regard, the one or more processors 325 of the controller 324 may be configured to "cut out" the regions of interest associated with the additional target 204 (i.e., the inner target) from the exterior region of interest 212 to form a "holed" composite exterior region of interest 218.

In a further aspect of the present invention, the one or more processors 325 of the computer controller 324 are configured to calculate one or more metrology parameters for the self-symmetric target structure 202 using the generated composite exterior region 218. For example, the one or more processors 325 of the computer controller 324 may calculate the symmetry point for the self-symmetric target structure 202 using the generated composite exterior region 218.

In another aspect of the present invention, the one or more processors 325 of the computer controller 324 are configured to calculate one or more metrology parameters for the additional target structure 204 using the defined one or more interior regions of interest 214. For example, the one or more processors 325 of the computer controller 324 may calculate the symmetry point for the additional target structure 204 using the defined one or more interior regions of interest 214.

It is noted herein that the system 300 described above may be extended to measure overlay using the imaging overlay target with three or more target structures, such as overlay target 290 described previously herein. In this regard, the one or more processors 325 of the computer controller 324 are configured to calculate one or more metrology parameters for the symmetric structure 202, the first additional structure 204 and/or the at least a second symmetric structure 292 (see FIG. 2H) using the "holed" concept described throughout the present disclosure.

The illumination source 302 of the system 300 may include any illumination source known in the art. In one embodiment, the illumination source 302 may include a broadband light source (e.g., white light source). For example, the illumination source 302 may include, but is not limited to, a halogen light source (HLS). For instance, the halogen light source may include, but is not limited to, a tungsten based halogen lamp. In another example, the illumination source 302 may include a Xenon arc lamp. In another embodiment, the illumination source 302 may include a narrowband light source. For example, the illumination source 302 may include, but is not limited to, one or more lasers.

In one embodiment, the one or more optical elements of the system 300 may include, but are not limited to, one or more beam splitters 306. For example, the beam splitter 306 of the system 300 may split the light beam 320 emanating from an illumination source 302 into two paths: an object path 312 and a reference path 314. In this sense, the object path 312 and the reference path 314 of the system 300 may form a portion of a two beam interference optical system. For example, the beam splitter 306 may direct a first portion of the beam of light from the illumination path 320 along the object path 312, while allowing a second portion of the beam of light from the illumination path 320 to be transmitted along the reference path 314. More specifically, the beam splitter 306 may direct a portion of the light emanating from the illumination source 302 to the one or more exclusion based targets 317 of the specimen 316 (e.g., via object path 312) disposed on the specimen stage 318. Moreover, the beam splitter 306 may transmit a second portion of the light emanating from the illumination source 302 to the components of the reference path 314. For instance, the beam splitter 306 may transmit a portion of light from the illumination path 320 along the reference path 314 to a reference mirror (not shown). It should be recognized by those skilled in the art that any beam splitter known in the art is suitable for implementation as the beam splitter 306 of the present invention.

It should be apparent to those skilled in the art that the reference path 314 may include, but is not limited to, a reference mirror, a reference objective, and a shutter configured to selectively block the reference path 314. In a general sense, a two-beam interference optical system may be configured as a Linnik interferometer. Linnik interferometry is described generally in U.S. Pat. No. 4,818,110, issued on Apr. 4, 1989, and U.S. Pat. No. 6,172,349, issued on Jan. 9, 2001, which are incorporated herein by reference in their entirety.

In another embodiment, the system 300 may include a main objective lens 308. The main objective lens 308 may aid in directing light along the object path 312 to the surface of the specimen 316 disposed on the specimen stage 318. For example, the beam splitter 306 may direct a portion of the light beam 320 emanating from the illumination source 302. Following the splitting process by the beam splitter 306, the main objective lens 308 may focus light from the object path 312, which is collinear with the primary optical axis 304, onto the exclusion based target(s) 317 of the specimen 316. In a general sense, any objective lens known in the art may be suitable for implementation as the main objective lens 308 of the present invention.

Further, a portion of the light impinging on the surface of the specimen 316 may be reflected by the exclusion based target(s) 317 of the specimen 316 and directed along the primary optical axis 304 via the objective 308 and the beam splitter 306 toward the detector 310. It should be further recognized that intermediate optical devices such as intermediate lenses, additional beam splitters (e.g., a beam splitter configured to split off a portion of light to a focusing system), filters, polarizers, imaging lenses 305 and the like may be placed between the objective 308 and the imaging plane of the detector 310.

In another embodiment, the detector 310 of the system 300 may be disposed along the primary optical axis 304 of the system 300. In this regard, the detector 300 may be arranged to collect imagery data from the surface of the specimen 316. For example, in a general sense, after reflecting from the surface of the specimen 316, light may travel along the primary optical axis 304 to the image plane of the detector 310 via the main objective 308 and the beam splitter 306. It is recognized that any detector system known in the art is suitable for implementation in the present invention. For example, the detector 310 may include a charge coupled device (CCD) based camera system. By way of another example, the detector 310 may include a time delay integration (TDI)-CCD based camera system. In a further aspect, the detector 310 may be communicatively coupled with the computer controller 324. In this regard, digitized imagery data may be transmitted from the detector 310 to the computer controller 324 via a signal, such as a wireline signal (e.g., copper line, fiber optic cable, and the like) or a wireless signal (e.g., wireless RF signal).

While the above description describes the detector 310 as being located along the primary optical axis 304 of the system 300, this characteristic should not be interpreted as a requirement. It is contemplated herein that the detector 310 may reside along an additional optical axis of the system 300. For example, in a general sense, one or more additional optical elements (e.g., mirrors, beam splitters and the like) may be utilized to divert a portion of light reflected from the surface of the specimen 316 and traveling along the object path 312 onto an additional optical axis, which is non-parallel to the object path 312. The camera 310 may be arranged such that light traveling along the additional optical axis impinges the image plane of the camera 310.

Figure 4:
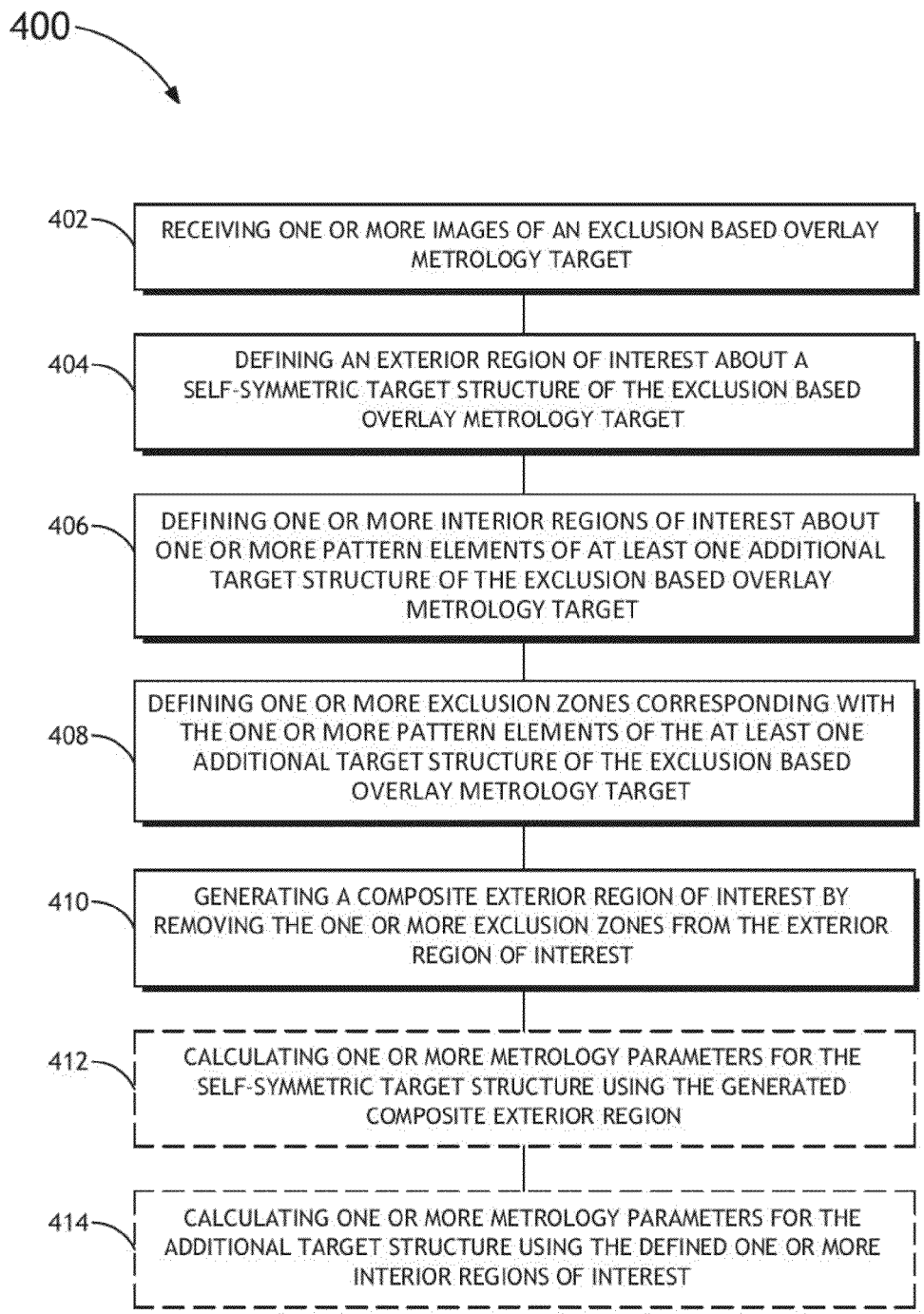
FIG. 4 is process flow diagram depicting a method for measuring imaging overlay from an exclusion based overlay metrology target, in accordance with one embodiment of the present invention.

FIG. 4 illustrates a method 400 for exclusion based region of interest imaging overlay metrology, in accordance with one embodiment of the present invention. It is noted herein that method 400 of the present disclosure may be carried utilizing one or more of the exclusion ROI based metrology targets 200, 240, 260 and 280 along with the exclusion ROI based metrology tool 300 described previously herein. The targets and metrology tools described previously herein should not be interpreted as limitations on method 400 as it is anticipated that other target and metrology tool configurations may be used to carry out method 400.

In step 402, one or more images of an exclusion based overlay metrology target disposed on a sample are received. For example, imagery data from detector 310 may be transmitted to and received by the one or more processors 325 of the computer controller 324.

In step 404, an exterior region of interest about a self-symmetric target structure of the exclusion based overlay metrology target is defined. For example, utilizing the exclusion ROI algorithm 328 stored in memory medium 326 the one or more processors 325 of the computer controller 324 may define an exterior region of interest 212 about the self-symmetric target structure 202 of an exclusion based target (e.g., 200, 240, 260 and 280). In a further embodiment, the computer controller 324 may display the exterior region of interest and the target on a display portion of a user interface device communicatively coupled to the computer controller 324, allowing inspection of the exterior region of interest in relation to the target.

In step 406, one or more interior regions of interest about one or more pattern elements of an additional target structure of the exclusion based overlay metrology target are defined. For example, utilizing the exclusion ROI algorithm 328 stored in memory medium 326 the one or more processors 325 of the computer controller 324 may define one or more interior regions of interest 214 about the one or more pattern elements (e.g., 208a-208d) of the additional target structure 204 of an exclusion based target (e.g., 200, 240, 260 and 280). In a further embodiment, the computer controller 324 may display the interior regions of interest and the target on a display portion of a user interface device communicatively coupled to the computer controller 324, allowing inspection of the interior regions of interest in relation to the target.

In step 408, one or more exclusion zones corresponding with the one or more pattern elements of an additional target structure of the exclusion based overlay metrology target are defined. For example, utilizing the exclusion ROI algorithm 328 stored in memory medium 326 the one or more processors 325 of the computer controller 324 may define one or more exclusion zones 214 about the one or more pattern elements (e.g., 208a-208d) of the additional target structure 204 of an exclusion based target (e.g., 200, 240, 260 and 280). In a further embodiment, the computer controller 324 may display the exclusion zones and the target on a display portion of a user interface device communicatively coupled to the computer controller 324, allowing inspection of exclusion zones in relation to the target In step 410, a composite exterior region of interest is generated by removing the one or more exclusion zones from the exterior region of interest. For example, utilizing the exclusion ROI algorithm 328 stored in memory medium 326 the one or more processors 325 of the computer controller 325 may generated a composite exterior region of interest 218.

For instance, the composite exterior region of interest 218 may be generated by removing or subtracting the exclusion zones 214 from the exterior region of interest 212. This removal process results in a "holed" composite exterior region of interest 218.

In step 412, one or more metrology parameters for the self-symmetric target structure are calculated using the generated composite exterior region. For example, utilizing the exclusion ROI algorithm 328 stored in memory medium 326 the one or more processors 325 of the computer controller 325 may calculate one or more metrology parameters for the self-symmetric target structure based on the generated composite exterior region of interest 218. For instance, the computer controller 325 may calculate the center of symmetry of the self-symmetric structure 202 using the generated composite exterior region of interest 218. It is recognized herein that any algorithm or set of algorithms known in the art used to calculate metrology parameters, such as the center of symmetry, are extendable to the calculation of one or more metrology parameters associated with the composite exterior region of interest 218.

In step 414, one or more metrology parameters for the additional target structure are calculated using the one or more interior regions of interest. For example, utilizing the exclusion ROI algorithm 328 stored in memory medium 326 the one or more processors 325 of the computer controller 325 may calculate one or more metrology parameters for the additional target structure 204 based on the defined one or more interior regions of interest 214. For instance, the computer controller 325 may calculate the center of symmetry of the additional target structure 204 using the defined one or more interior regions of interest 214. It is noted herein that in cases where the interior regions of interest 214 are coextensive with the exclusion zones 216, the algorithm 328 may utilize the defined exclusion zones 216 to calculate one or more metrology parameters of the additional structure 204. It is recognized herein that any algorithm or set of algorithms known in the art used to calculate metrology parameters, such as the center of symmetry, are extendable to the calculation of one or more metrology parameters associated with the one or more interior region s.

It is further noted herein that the method 400 may be extended to calculate one or more metrology parameters for each target structure of a target containing three or more overlapping target structures, such as the target 290 depicted in FIG. 2H.

All of the system and methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. An imaging overlay metrology target, comprising:
    a self-symmetric target structure including two or more pattern elements; and
    at least an additional target structure including two or more pattern elements, wherein each of the two or more pattern elements of the at least an additional target structure is contained within a boundary defined by one of the two or more pattern elements of the self-symmetric target structure,
    wherein the self-symmetric target structure is characterized by a composite exterior region of interest, wherein the composite exterior region of interest is formed by removing two or more exclusion zones corresponding with the two or more pattern elements of the at least an additional target structure from an exterior region of interest encompassing the self-symmetric target structure,
    wherein the two or more pattern elements of the at least an additional target structure are characterized by two or more interior regions of interest, wherein each of the pattern elements of the at least an additional target structure is characterized by an interior region of interest, wherein the two or more interior regions of interest are contained within the exterior region of interest,
    wherein the self-symmetric target structure and the at least an additional target structure are configured to have a common center of symmetry upon alignment of the self-symmetric target structure and the at least an additional target structure,
    wherein the self-symmetric structure is invariant to N degree rotation about the common center of symmetry,
    wherein the at least an additional target structure is invariant to M degree rotation about the individual center of symmetry.

2. The imaging overlay target of claim 1, wherein the two or more interior regions of interest are substantially coextensive with the two or more exclusion zones.

3. The imaging overlay target of claim 1, wherein a first pattern element of the two or more pattern elements of the self-symmetric target structure is suitable for overlay metrology measurements in a first direction and a second pattern element of the two or more pattern elements is suitable for overlay metrology measurements in a second direction different from the first direction.

4. The imaging overlay target of claim 1, wherein a first pattern element of the two or more pattern elements of the at least an additional target structure is suitable for overlay metrology measurements in a first direction and a second pattern element of the two or more pattern elements of the at least an additional target structure is suitable for overlay metrology measurements in a second direction different from the first direction.

5. The imaging overlay target of claim 1, wherein at least one of the two or more pattern elements of the self-symmetric target structures comprises:
a pattern element having two or more sub-elements.

6. The multilayer overlay target of claim 5, wherein pattern element having two or more sub-elements comprises:
a pattern element having two or more sub-elements, wherein the two or more sub-elements are arranged in a periodic pattern.

7. The multilayer overlay target of claim 5, wherein pattern element having two or more sub-elements comprises:
a segmented pattern element.

8. The imaging overlay target of claim 1, wherein at least one of the two or more pattern elements of the self-symmetric target structures comprises:
a non-segmented pattern element.

9. The imaging overlay target of claim 1, wherein at least one of the two or more pattern elements of the at least an additional target structures comprises:
a pattern element having two or more sub-elements.

10. The multilayer overlay target of claim 9, wherein pattern element having two or more sub-elements comprises:
a pattern element having two or more sub-elements, wherein the two or more sub-elements are arranged in a periodic pattern.

11. The multilayer overlay target of claim 9, wherein pattern element having two or more sub-elements comprises:
a segmented pattern element.

12. The imaging overlay target of claim 1, wherein at least one of the two or more pattern elements of the at least an additional target structures comprises:
a non-segmented pattern element.

13. The multilayer overlay target of claim 1, wherein the self-symmetric target structure and the at least an additional target structure are disposed at different process layers.

14. The multilayer overlay target of claim 1 wherein the self-symmetric target structure and the at least an additional target structure are disposed within the same layer, the self-symmetric target structure and the at least an additional target structure exposed in different lithographic processes.

15. The imaging overlay target of claim 1, wherein at least one of N and M is equal to or greater than 90 degrees.

16. The imaging overlay target of claim 1, wherein at least one of N and M is equal to or greater than 180 degrees.

17. The imaging overlay target of claim 1, wherein the self-symmetric target structure and the at least an additional target structure are configured to form at least a portion of an AIMid metrology target.

18. An imaging overlay metrology target, comprising:
a self-symmetric target structure including a single pattern element,
at least an additional target structure including one or more pattern elements, wherein the one or more pattern elements of the at least an additional target structure are contained within a boundary defined by the single pattern element of the self-symmetric target structure,
wherein the self-symmetric target structure is characterized by a composite exterior region of interest, wherein the composite exterior region of interest is formed by removing one or more exclusion zones corresponding with the one or more pattern elements of the at least an additional target structure from an exterior region of interest encompassing the self-symmetric target structure,
wherein the one or more pattern elements of the at least an additional target structure are characterized by one or more interior regions of interest, wherein the one or more interior regions of interest are contained within the exterior region of interest,
wherein the self-symmetric target structure and the at least an additional target structure are configured to share a common center of symmetry upon alignment of the self-symmetric target structure and the at least an additional target structure,
wherein the self-symmetric structure is invariant to N degree rotation about the common center of symmetry,
wherein the at least an additional target structure is invariant to M degree rotation about the individual center of symmetry.

19. The imaging overlay target of claim 18, wherein the at least an additional target structure including one or more pattern elements comprises:
at least an additional target structure including a single pattern element.

20. The imaging overlay target of claim 18, wherein the at least an additional target structure including one or more pattern elements comprises:
at least an additional target structure including two or more pattern elements.

21. The imaging overlay target of claim 18, wherein the one or more interior regions of interest are substantially coextensive with the one or more exclusion zones.

22. The imaging overlay target of claim 18, wherein the single pattern elements of the self-symmetric target structures comprises:
a pattern element having two or more sub-elements.

23. The imaging overlay target of claim 18, wherein the pattern element having two or more sub-elements comprises:
a pattern element having two or more sub-elements, wherein the two or more sub-elements are arranged in a periodic pattern.

24. The imaging overlay target of claim 18, wherein the pattern element having two or more sub-elements comprises:
a segmented pattern element.

25. The imaging overlay target of claim 18, wherein the single pattern element of the self-symmetric target structures comprises:
a non-segmented pattern element.

26. The imaging overlay target of claim 18, wherein the two or more pattern elements of the at least an additional target structures comprises:
a pattern element having two or more sub-elements.

27. The imaging overlay target of claim 26, wherein pattern element having two or more sub-elements comprises:
a pattern element having two or more sub-elements, wherein the two or more sub-elements are arranged in a periodic pattern.

28. The imaging overlay target of claim 26, wherein pattern element having two or more sub-elements comprises:
a segmented pattern element.

29. The imaging overlay target of claim 18, wherein the one or more pattern elements of the at least an additional target structures comprises:
a non-segmented pattern element.

30. The imaging overlay target of claim 18, wherein the self-symmetric target structure and the at least an additional target structure are disposed at different process layers.

31. The imaging overlay target of claim 18, wherein the self-symmetric target structure and the at least an additional target structure are disposed within the same layer, the self-symmetric target structure and the at least an additional target structure exposed in different lithographic processes.

32. The imaging overlay target of claim 18, wherein at least one of N and M is equal to or greater than at least one of 90 degrees and 180 degrees.

33. The imaging overlay target of claim 18, wherein the self-symmetric target structure and the at least an additional target structure are configured to form at least a portion of an AlMid metrology target.

34. An imaging overlay metrology target, comprising:
a self-symmetric target structure including one or more pattern elements;
a first additional target structure including one or more pattern elements;
at least a second additional target structure including one or more pattern elements,
wherein the one or more pattern elements of the first additional target structure are contained within a boundary defined by the self-symmetric target structure,
wherein the one or more pattern elements of the at least a second additional target structure are contained within a boundary defined by the first additional target structure,
wherein the self-symmetric target structure is characterized by a composite exterior region of interest, wherein the composite exterior region of interest is formed by removing one or more exclusion zones corresponding with the one or more pattern elements of the first additional target structure from an exterior region of interest encompassing the self-symmetric target structure,
wherein the first additional target structure is characterized by an additional composite region of interest, wherein the additional composite region of interest is formed by removing one or more exclusion zones corresponding with the one or more pattern elements of the at least a second additional target structure from an additional region of interest encompassing the first additional target structure,
wherein the one or more pattern elements of the first additional target structure are characterized by one or more first interior regions of interest, wherein the one or more pattern elements of the at least a second additional target structure are characterized by one or more at least a second interior regions of interest, wherein the one or more first interior regions of interest and the one or more at least a second interior regions of interest are contained within the exterior region of interest,
wherein the self-symmetric target structure, the first additional structure and the at least a second additional target structure are configured to share a common center of symmetry upon alignment of the self-symmetric target structure, the first additional structure and the at least a second additional target structure,
wherein the self-symmetric structure is invariant to N degree rotation about the common center of symmetry, wherein the first additional target structure is invariant to M degree rotation about the individual center of symmetry, wherein the at least a second additional target structure is invariant to L degree rotation about the individual center of symmetry.

35. The imaging overlay target of claim 34, wherein the self-symmetric target structure, the first additional target structure and the at least a second additional target structure are disposed at different process layers.

36. The imaging overlay target of claim 34, wherein at least one of the self-symmetric target structure, the first additional target structure and the at least a second additional target structure include a single pattern element.

37. The imaging overlay target of claim 34, wherein at least one of the self-symmetric target structure, the first additional target structure and the at least a second additional target include two or more pattern elements.

38. The imaging overlay target of claim 34, wherein at least one of N, M and L is equal to or greater than at least one of 90 degrees and 180 degrees.

39. The imaging overlay target of claim 34, wherein the self-symmetric target structure, the first additional target structure and the at least a second additional target structure are configured to form at least a portion of an AlMid metrology target.

40. An apparatus suitable for measuring imaging overlay from an exclusion based overlay metrology target, comprising:
an illumination source configured to generate light;
one or more optical elements configured to direct a first portion of light from the illumination source along an object path to one or more exclusion based overlay metrology targets disposed on one or more specimens and a second portion of light from an illumination source along a reference path;
a detector configured to collect a portion of light reflected from the exclusion based metrology target of the one or more specimens; and
a computer controller communicatively coupled to the detector, wherein the computer controller is configured to:
receive one or more images of the exclusion based overlay metrology target from the detector;
define an exterior region of interest about a self-symmetric target structure of the exclusion based overlay metrology target;
define one or more interior regions of interest about one or more pattern elements of an additional target structure of the exclusion based overlay metrology target;
define one or more exclusion zones corresponding with the one or more pattern elements of the additional target structure of the exclusion based overlay metrology target; and
generate a composite exterior region of interest by removing the one or more exclusion zones from the exterior region of interest.

41. The apparatus of claim 40, wherein computer controller is further configured to calculate one or more metrology parameters for the self-symmetric target structure using the generated composite exterior region.

42. The apparatus of claim 40, wherein computer controller is further configured to calculate one or more metrology parameters for the additional target structure using the defined one or more interior regions of interest.

43. The apparatus of claim 40, wherein the illumination source comprises:
at least one of a broadband source and a narrowband source.

44. The apparatus of claim 40, wherein the exclusion based metrology target comprises:
- a self-symmetric target structure including two or more pattern elements; and
- at least an additional target structure including two or more pattern elements, wherein each of the two or more pattern elements of the at least an additional target structure is contained within a boundary defined by one of the two or more pattern elements of the self-symmetric target structure;
- wherein the self-symmetric target structure and the at least an additional target structure are configured to have a common center of symmetry upon alignment of the self-symmetric target structure and the at least an additional target structure,
- wherein the self-symmetric structure is invariant to N degree rotation about the common center of symmetry,
- wherein the at least an additional target structure is invariant to M degree rotation about the individual center of symmetry.

45. The apparatus of claim 40, wherein the exclusion based metrology target comprises:
- a self-symmetric target structure including a single pattern element; and
- at least an additional target structure including one or more pattern elements, wherein the one or more pattern elements of the at least an additional target structure are contained within a boundary defined by the single pattern element of the self-symmetric target structure,
- wherein the self-symmetric target structure and the at least an additional target structure are configured to share a common center of symmetry upon alignment of the self-symmetric target structure and the at least an additional target structure,
- wherein the self-symmetric structure is invariant to N degree rotation about the common center of symmetry,
- wherein the at least an additional target structure is invariant to M degree rotation about the individual center of symmetry.

46. A method for measuring imaging overlay from an exclusion based overlay metrology target, comprising:
- receiving one or more images of an exclusion based overlay metrology target disposed on a sample;
- defining an exterior region of interest about a self-symmetric target structure of the exclusion based overlay metrology target;
- defining one or more interior regions of interest about one or more pattern elements of an additional target structure of the exclusion based overlay metrology target;
- defining one or more exclusion zones corresponding with the one or more pattern elements of the additional target structure of the exclusion based overlay metrology target; and
- generating a composite exterior region of interest by removing the one or more exclusion zones from the exterior region of interest.

47. The method of claim 46, further comprising:
- calculating one or more metrology parameters for the self-symmetric target structure using the generated composite exterior region.

48. The method of claim 46, further comprising:
- calculating one or more metrology parameters for the additional target structure using the defined one or more interior regions of interest.

* * * * *